(12) United States Patent
Hess

(10) Patent No.: US 11,770,896 B2
(45) Date of Patent: Sep. 26, 2023

(54) COMPONENT CARRIER FOR ARRANGING ELECTRICAL COMPONENTS ON A CIRCUIT BOARD

(71) Applicant: HARTING AG, Biel (CH)

(72) Inventor: Thomas Hess, Biel (DE)

(73) Assignee: HARTING AG

(*) Notice: Subject to any disclaimer, the term of this patent is extended or adjusted under 35 U.S.C. 154(b) by 0 days.

(21) Appl. No.: 17/760,259

(22) PCT Filed: Feb. 4, 2021

(86) PCT No.: PCT/IB2021/050923
§ 371 (c)(1),
(2) Date: Aug. 5, 2022

(87) PCT Pub. No.: WO2021/156793
PCT Pub. Date: Aug. 12, 2021

(65) Prior Publication Data
US 2023/0061125 A1    Mar. 2, 2023

(30) Foreign Application Priority Data
Feb. 5, 2020    (DE) .................. 10 2020 102 983.7

(51) Int. Cl.
H05K 1/14    (2006.01)
H05K 3/34    (2006.01)
H05K 1/11    (2006.01)

(52) U.S. Cl.
CPC .......... H05K 1/119 (2013.01); H05K 1/141 (2013.01); H05K 3/341 (2013.01); H05K 2201/09118 (2013.01); H05K 2201/10568 (2013.01)

(58) Field of Classification Search
CPC .............. H05K 1/119; H05K 1/141; H05K 3/341–3/3442
See application file for complete search history.

(56) References Cited

U.S. PATENT DOCUMENTS

| 6,115,261 A | 9/2000 | Platt et al. |
| 2005/0168961 A1 | 8/2005 | Ono et al. |
| 2006/0183358 A1 | 8/2006 | Iida et al. |

FOREIGN PATENT DOCUMENTS

| DE | 102006015676 | 6/2007 |
| DE | 102011055117 | 5/2013 |

(Continued)

OTHER PUBLICATIONS

German Search Report issued in German Patent Appln. Serial No. 10 2020 102 983.7, dated Jul. 1, 2022, with machine English translation, 15 pages.

(Continued)

Primary Examiner — Jeremy C Norris
(74) Attorney, Agent, or Firm — HAYES SOLOWAY P.C.

(57) ABSTRACT

Disclosed are special component carriers made of MID-capable plastic in order to make the geometric arrangement of electrical components, such as microprocessors, LEDs, sensors, antennas and the like, on a circuit board more flexible. Said component carriers can have a standardized footprint for connecting to the circuit board and can be adapted to the terminals and the geometric arrangement of the components using individually applied conducting tracks, in particular in an LDS process. Furthermore, the specially shaped component carriers allow the electrical components to be geometrically oriented, in particular at a right angle to the circuit board and parallel to the circuit board, which is especially highly advantageous for antennas and acceleration sensors. Furthermore, SMT soldering is made possible in the pre-mounted state even for temperature-sensitive components.

16 Claims, 5 Drawing Sheets

(56) References Cited

FOREIGN PATENT DOCUMENTS

Figure 1A:
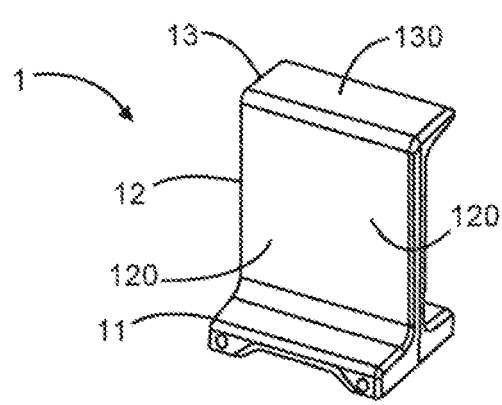

| DE | 102013100197 | 7/2014 | |
|----|--------------|--------|---|
| JP | H6-181375 | 6/1994 | |
| WO | WO 2013189486 | 12/2013 | |
| WO | WO2013189489 | 12/2013 | ............... H05K 3/10 |

OTHER PUBLICATIONS

International Search Report, Written Opinion and International Preliminary Report on Patentability issued in corresponding PCT International Patent Application serial NO. PCT/IB2021/050923, dated May 25, 2021, 30 pages.

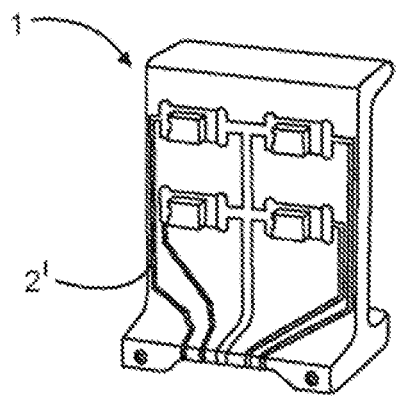
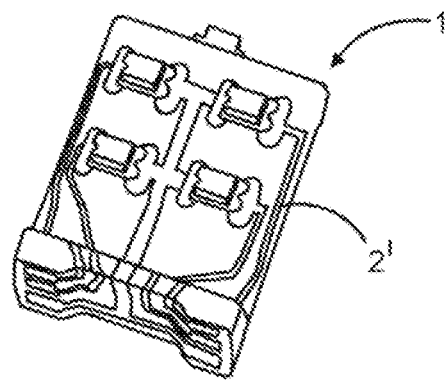
Fig. 2a      Fig. 2b
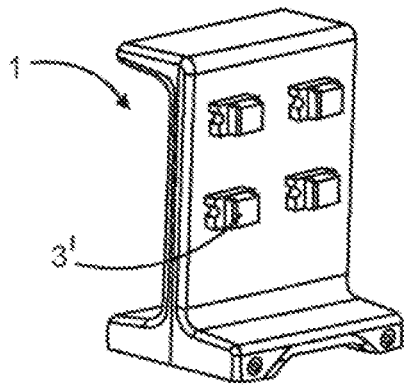
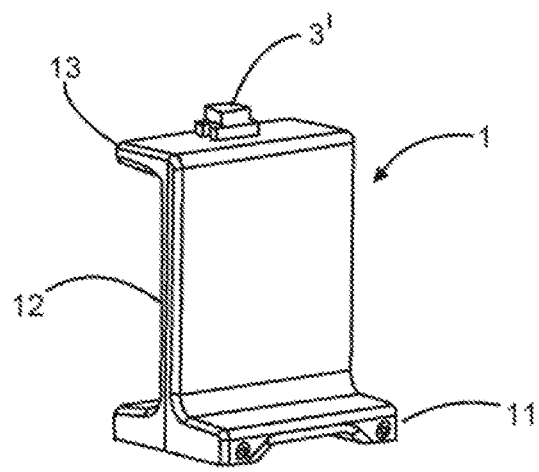
Fig. 2c      Fig. 2d
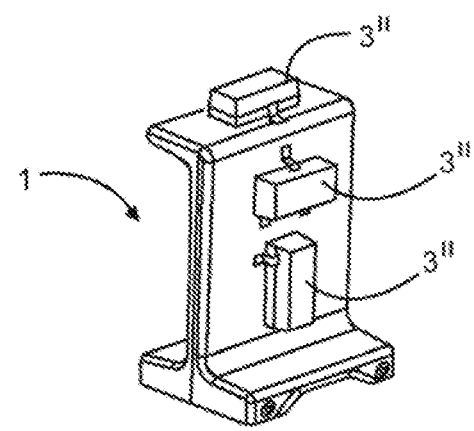
Fig. 2e

COMPONENT CARRIER FOR ARRANGING ELECTRICAL COMPONENTS ON A CIRCUIT BOARD

DESCRIPTION

The invention starts with a component carrier for arranging electrical components on a circuit board according to the preamble of the independent claim 1.

The invention furthermore starts with a method for populating a circuit board with electrical components by means of at least one component carrier according to claim 1.

Such component carriers and methods are needed to fasten electrical components on circuit boards and to electrically connect them thereto.

Prior Art

In the prior art, it is known to populate circuit boards with electrical components in an automated manner. In particular, this can take place by means of the widely used "surface mounted technology" (SMT).

A central issue with the automated population of circuit boards is that these components often possess individual connections. This complicates both the circuit board layout and the flexibility of the population process with regard to the subsequent selection of suitable components. In particular, automating the population of the circuit board with alternative components, which would definitely be attractive in terms of function and cost, may be hampered or even impossible.

Owing to their temperature-sensitivity, many electrical components are not readily suitable for SMT soldering.

Furthermore, the lack of installation space on circuit boards is regarded as problematic for virtually all circuit designs, i.e. the available installation space must essentially be used as effectively as possible so as to enable the greatest possible functionality in the smallest possible space. Consequently, the temperature development due to powerful electronic components, e.g. microprocessors, may also often cause problems during operation, which means that cooling bodies and/or fans need to be used, which in turn further increases the spatial requirement.

Object

The object of the invention is to simplify the automated population of circuit boards, or even simply enable it in the first place. In particular, at the same time, the aim is to increase the flexibility of component selection.

The object is achieved by the subject matter of the independent claims.

A component carrier is made of an electrically insulating material, in particular a plastic, and is preferably manufactured using a so-called "MID" (molded interconnect device) method and in particular using a so-called "LDS" (laser direct structuring) method. To this end, the component carrier can be made of one or more MID-capable and in particular LDS-capable plastic(s) or comprise this/these to at least some extent. The component carrier possesses a base region with one or more supporting surfaces for electrical and mechanical connection to a circuit board. The component carrier furthermore possesses a substantially flat connecting portion, which extends substantially at a right angle to the supporting surface(s) of the base region and possesses at least one planar lateral surface, on which one or more electrical components can be assembled. At an end of the connecting portion which is remote from the base region, the component carrier possesses a top surface, which is aligned parallel to the base region. This top surface can be used both as a suction surface for automated circuit board population, for example using the SMT method, and for the assembly of one or more further electrical components. The component carrier is provided with a plurality of traces, which, on the circuit board connection side, are guided along at least one of the supporting surfaces of the base region and end there in order to be soldered to the circuit board by their respective circuit board connection regions. At their other end in each case, the traces are guided to the respective assembly position of one of the electrical components and end there in each case with their component connection regions at least in the vicinity of the electrical connections of the component which is to be assembled there.

In this case, the word group "substantially flat" means that the connecting portion is designed to be flat on at least one side or must at least possess a flat region which is large enough for assembling an electrical component. "Substantially at a right angle" means that, from the base region to the top region, the connecting portion can also have a slight conical taper in cross section. However, in this case, the plane of symmetry between the two mutually opposing lateral surfaces of the connecting portion, which taper conically towards one another, can, in particular, extend at a right angle to the supporting surface(s) of the base region. In this case, the angles which are formed by the lateral surfaces of such a conically tapering connecting portion and the supporting surface(s) of the base region can therefore be slightly greater than or equal to 90°. In this case, slightly greater than 90° means that the said angles are between 90° and 100°, preferably between 90° and 95°, particularly preferably between 90° and 94°, in particular between 90° and 93°, i.e., by way of example, between 90° and 92°, e.g. between 90° and 91°.

A method for populating the circuit board with the electrical components possesses the following steps:
 a.) creating a circuit board design with traces and at least one standardized geometrical arrangement of the contact connections thereof, namely a so-called "footprint";
 b.) producing the circuit board with the circuit board design;
 c.) selecting or providing the at least one component carrier with traces, whereof the circuit board connection regions form a geometrical pattern corresponding to the footprint of the circuit board and which, on the other hand, on the component connection side, end in the region of a position on the component carrier which is provided for mounting the at least one electrical component;
 d.) mounting the at least one electrical component in its intended position on the connecting portion or on the top surface of the component carrier;
 e.) electrically connecting the electrical connections of the electrical component to the component connection regions of the traces;
 f.) populating the circuit board with the at least one component carrier (1) by soldering the circuit board connection regions (20) of the component carrier to the contact connections of the circuit board.

In this case, it is of course clear to a person skilled in the art that the method steps c.) and d.) can also be carried out before the method step b.) and in particular also before the method step a.).

Advantageous configurations of the invention are specified in the subclaims and in the description below.

The invention enables considerable simplification of automated circuit board population.

A particular advantage of the invention is, in particular, that the component carrier enables the at least one electrical component to be arranged substantially perpendicularly and/or parallel to the circuit board.

As a result of the invention, it is furthermore advantageously possible to avoid having to alter a circuit board design when a particular component is exchanged for another—e.g. functionally identical or functionally similar—alternative component by another manufacturer, since the connections of the alternative component are located in other positions. In this case, as a result of the invention, it is furthermore advantageously possible to avoid having to put up with highly complex wiring using individual stranded wires. There is also no need to switch to using flexible or rigid-flexible circuit boards for the connection of the alternative component.

Instead, the assembly is shown to require comparatively little effort as a result of the electrical components firstly being assembled on the associated component carrier in each case and connected to the traces thereof on the component side. In this form, the components can be mounted on the component carrier as a pre-assembly or used immediately.

The component carrier is then in turn assembled immediately or as required on the circuit board and connected, e.g. soldered, to the preferably standardized footprint thereof. In this case, the soldering of the circuit board connection regions of the component carrier to the said contact connections of the circuit board can take place using the said SMT technology, wherein, for the reasons mentioned above, there is no need to account for a possible temperature-sensitivity of the components which are arranged on the connecting portion and/or even on the top surface of the component carrier in question.

It goes without saying that this assembly order can also be reversed—i.e. the component carrier can firstly be assembled on the circuit board and the component can then be assembled on the component carrier, although this does not correspond to the desired sequence in most cases. Ultimately, the assembly is thus made more difficult in most cases, in particular if the electrical component is assembled on the connecting portion.

A particular advantage of the invention is that the component carrier can even be adapted to particular electrical components in very small batches using the LDS method. Ultimately, the traces can be adapted to the position of the connections of particular components with very little effort by laser activation, without affecting the form of the component itself.

An additional advantage is the saving on installation space on the circuit board thereof.

A further advantage of the invention is that the component carrier, in particular as a result of its shape, significantly reduces the heat transfer between the at least one electrical component fastened thereon and the circuit board. On the one hand, the temperature development in the operating state is thus reduced. On the other, automated population, in particular using surface mounted technology (SMT) soldering, is also enabled, even for temperature-sensitive electrical components. In particular, in this case, the assembly order in the production process can also be optimally adapted to the procedural requirements, i.e. the corresponding component can, for example, firstly be mounted on the component carrier and connected easily to the traces in an electrically conductive manner by its individual connections, which traces are applied to the component carrier individually for the corresponding component. The component carrier can then be easily soldered on the circuit board by means of the said SMT, regardless of the temperature-sensitivity of its component.

In a preferred configuration, the component carrier can have component connection regions ("contact pads") at the component-side ends of its traces, which connection regions are located in the vicinity of the respective connections of the electrical component. These can be applied to the component carrier together with the traces in an MID method, preferably in an LDS method. The circuit board connection regions of the supporting surfaces can be located in mutually fixed relative positions, which correspond to the said, in particular standardized, footprint(s) of the circuit board.

In a preferred configuration, the connecting portion of the component carrier can be designed to be flat on both sides and can therefore possesses two mutually opposing assembly surfaces. On the connecting portion, at an end which is remote from the base region, a top plate can be integrally formed such that it is parallel to the base region, in particular at a right angle to said connecting portion, which top plate has the top surface on its side which is remote from the base region.

In particular, the top plate can be integrally formed on the connecting portion such that it points away from the connecting portion on one side only, i.e. in the direction of one of its two mutually opposing lateral surfaces, so that the component carrier with its base region, its connecting portion and its top plate, integrally formed thereon on one side, has an l-shaped cross section according to the so-called "Courier New" font (typewriter letters). Although the top surface is thus reduced in size, at least an assembly surface of the connecting portion is advantageously also easily accessible in the installed state.

In a preferred configuration, the top plate can be integrally formed over the entire width of the connecting portion on the end of the connecting portion which is remote from the base region and can therefore have the same width as the connecting portion. The top surface is thus sufficiently large and therefore, for many applications, also suitable as a further assembly surface for somewhat larger electrical components.

In another configuration, the top plate is narrower than the connecting portion. It is then generally provided as a suction surface, and can also be used for relatively small electrical components. This variant has the advantage that it saves somewhat on material, which plays a very important role for example when using LDS material. Moreover, the subjacent assembly surface on the component connection regions can then be accessible. In particular, the top plate in this design can be integrally formed centrally on the end of the connecting portion so that the connecting portion, at its end which is remote from the base region, possesses a freestanding edge portion on both sides of the top plate in each case and therefore possesses a total of two freestanding edge portions, which are separated from one another by the top plate.

In a further configuration, the connecting portion can possess just one assembly surface. For reinforcement, a web can be integrally formed as a reinforcing element on the surface of the connecting portion which is opposite the assembly surface.

Alternatively, for reinforcement, a solid cylinder or a solid half-cone can also be integrally formed as a reinforcing element on the connecting portion, on its side which is opposite the assembly surface. Its surface which is remote from the base can form the top surface. If the reinforcing element is the said half-cone, this can furthermore be configured to taper conically from the base region to the top surface.

If the reinforcing element is the said half-cylinder or the half-cone, the connecting portion which is reinforced thereby, i.e. the connecting portion together with the respective reinforcing element, can be designed to be Q shaped, looking onto the top surface.

All these embodiments which comprise a reinforcing element thus have the advantage of increased stability, although they reduce the installation space for electrical components.

To counteract this, the component carrier, in a further advantageous configuration, can additionally have a further, in particular identically shaped, connecting portion, which is in particular parallel to the said connecting portion. The connecting portion and the further connecting portion can be connected to one another via a connecting region, which in turn possesses a surface which is remote from the base region and which forms the top surface. The connecting region can be arranged centrally between the two connecting portions, so that the two connecting regions, together with the connecting portion, form an H shape in plan view. The two large assembly surfaces of the connecting portion are thus maintained for possible assembly of the electrical components. A high degree of stability is also ensured as a result of this arrangement. Furthermore, as a result of this design, the center of gravity, which shifts as a result of mounting the electrical component, can be re-centered.

EXEMPLARY EMBODIMENT

Figure 3A:
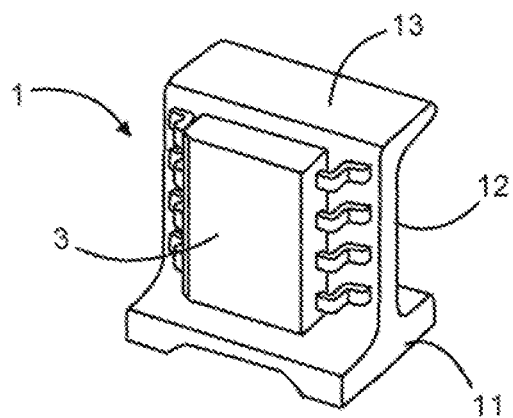
Figure 3B:
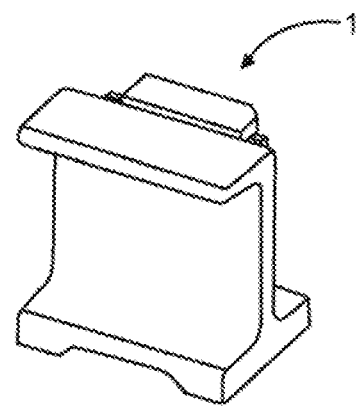
Figure 4A:
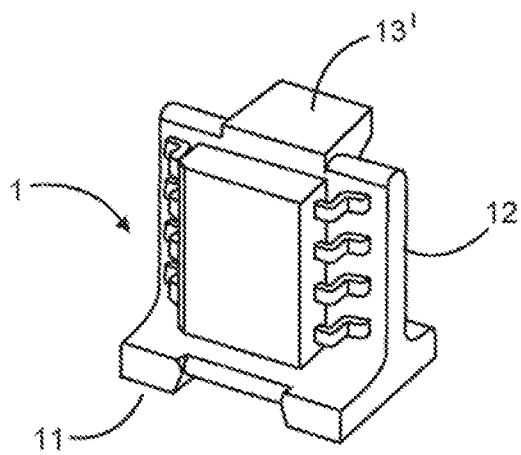
Figure 4B:
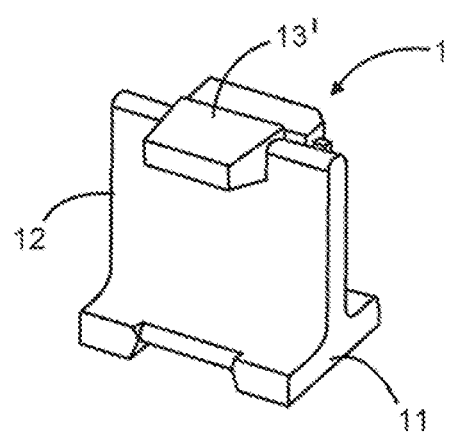
Figure 5A:
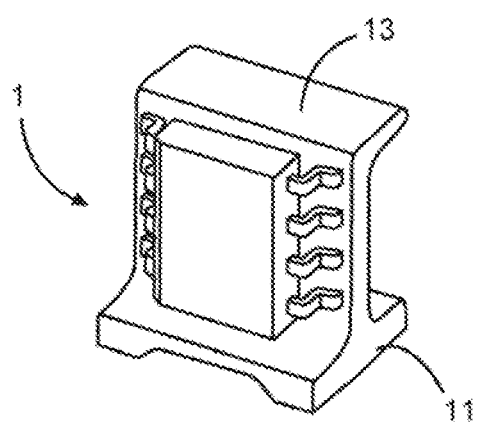
Figure 5B:
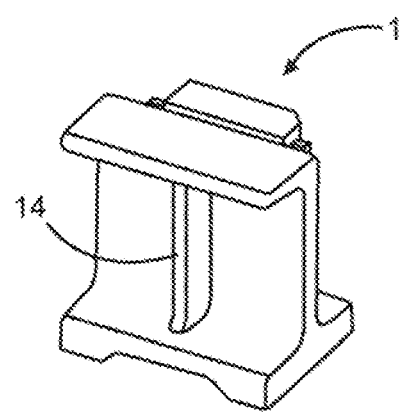
Figure 6A:
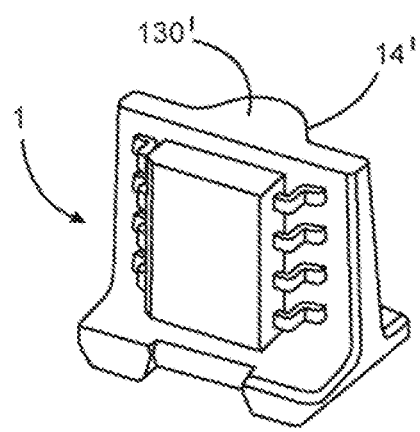
Figure 6B:
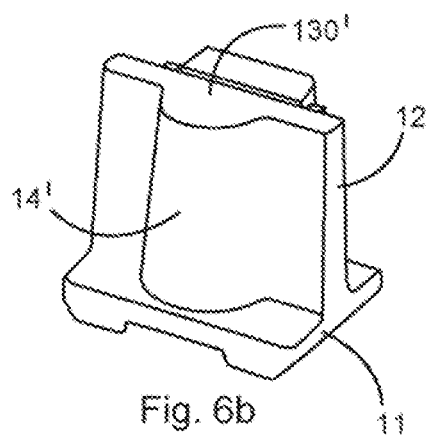
Figure 6C:
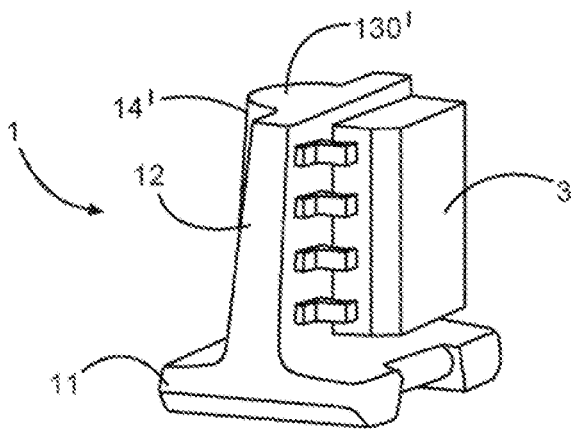
Figure 7A:
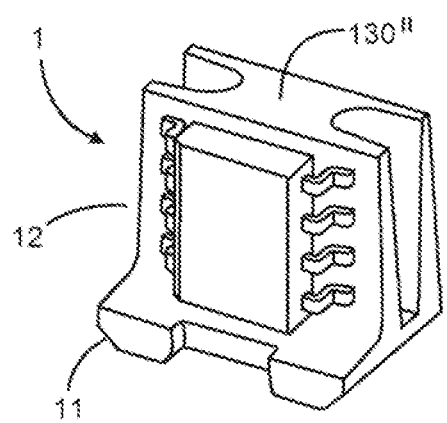
Figure 7B:
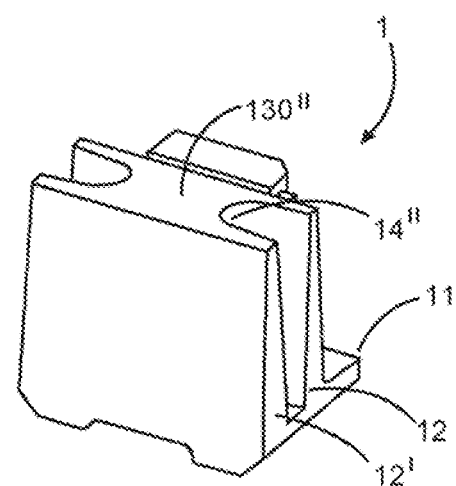

An exemplary embodiment of the invention is illustrated in the drawings and will be explained in more detail below. In the drawings:

FIG. 1a-f show a component carrier in a first embodiment;
FIG. 2a-e the component carrier in various applications;
FIG. 3a-b the component carrier in a second embodiment;
FIG. 4a-b the component carrier in a third embodiment;
FIG. 5a-b the component carrier in a fourth embodiment;
FIG. 6a-c the component carrier in a fifth embodiment;
FIG. 7a-b the component carrier in a sixth embodiment.

The figures contain partially simplified, schematic illustrations. Identical reference sings are sometimes used for elements which are similar, but possibly not identical. Different views of similar elements may be drawn to different scales.

Figure 1B:
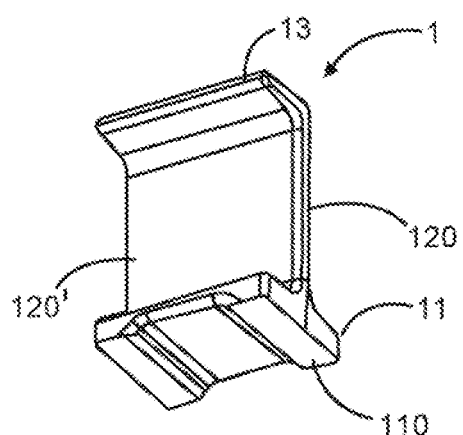

FIG. 1a-1f shows a component carrier 1 in a first embodiment with its base region 11, connecting portion 12 and a top plate 13, which is integrally formed on the connecting portion 12 and points away from the connecting portion. This component carrier possesses an l-shaped cross section according to the so-called "Courier New" font ("typewriter letters"). On its side which is remote from the base region 11, the top plate 13 has a top surface 130, which can be used as a suction surface in the case of automated circuit board population. In FIG. 1b, two supporting surfaces 110 of the base region 11 are illustrated at the bottom. These serve for contacting a circuit board (not shown in the drawing).

Figure 1C:
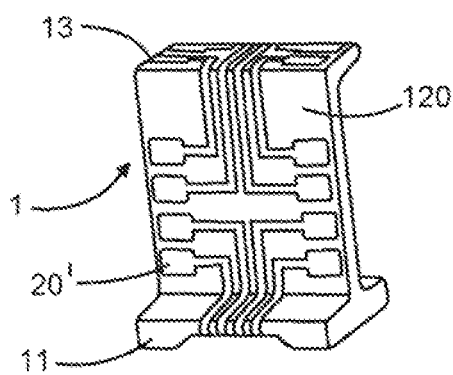
Figure 1D:
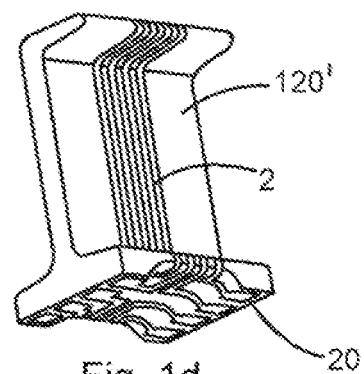

In FIGS. 1c and 1d, the component carrier is shown after it has been provided with traces 2 using an LDS (laser direct structuring) method. FIG. 1a enables a view of the assembly surface 120 of the connecting portion 12 and a view of the top surface 130 of the top plate 13. FIG. 1c enables a view of the top surface 130 and of the assembly surface 120 with the component connection regions 20'. The supporting surfaces 110 can be seen in FIG. 1d. Those ends of the traces 2 which are on the circuit board connection side are located with their circuit board connection regions 20 on the supporting surfaces.

Figure 1E:
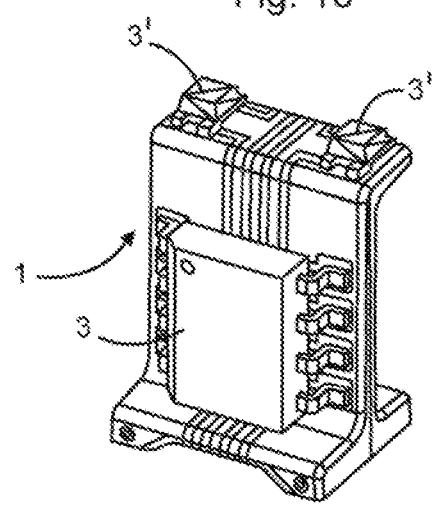
Figure 1F:
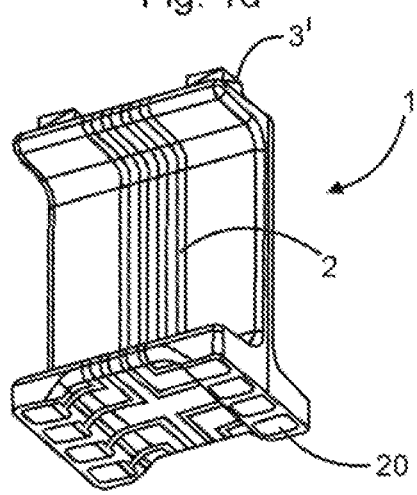

FIGS. 1e and 1f show the component carrier 1, which is populated with electrical components 3, 3' and is provided with corresponding traces 2.

FIGS. 2a and 2b show the component carrier with individually configured traces 2'. Using the LDS method, these traces 2 can be applied to the component carrier 1 for example by a customer or by customer request in order to enable the desired use of certain electrical components 3', and namely a desired geometrical arrangement.

FIG. 2c shows an associated application, in which four different-colored light-emitting diodes 3' are arranged on the assembly surface. In FIG. 2b, the component carrier 1 serves as a spacer for a light-emitting diode 3'. In FIG. 2e, three identical acceleration sensors 6 are arranged on the component carrier 1 in different orientations in order to be able to record the acceleration in three directions.

In FIGS. 3a and 3b, the component carrier 1 is shown in a second embodiment. In this case, the connecting portion 12 is somewhat shorter than in the first embodiment for the purpose of geometrical adaptation to the electrical component 3. The installation space on the lateral surface 12 is therefore somewhat smaller, i.e. it is suitable for somewhat smaller components 3, and the arrangement as a whole takes up less space.

In FIGS. 4a and 4b, the component carrier 1 is shown in a third embodiment. In this case, the top plate 13' is shorter than in the second embodiment. However, it can still serve as a suction surface and furthermore also as a further assembly surface for very small electrical components 3, 3", for example for one of the above-mentioned light-emitting diodes 3'. It points away from the connecting portion 12 and its assembly surface.

FIGS. 5a and 5b show the component carrier 1 in a fourth embodiment. This is comparable to the second embodiment, although it possesses an additional web 14 as a reinforcing element.

FIGS. 6a, 6b and 6c show the component carrier in a fifth embodiment. In this, the component carrier possesses a solid half-cone 14' as a reinforcing element, which extends from the base region 11 in the direction of the top surface 130' and tapers conically from the base region 11 to the top surface 130'. In this embodiment, the said top surface 130' is formed by the surface of the half-cone 14' which is remote from the base region 11.

FIGS. 7a and 7b show the component carrier 1 in a sixth embodiment. In this, the component carrier possesses a further connecting portion 12'. The connecting portion 12 and the further connecting portion 12' are connected to one another via a solid connecting region 14" as a reinforcing element, whereof the side which is remote from the base region 11 forms the top surface 130".

In this case, the connecting region 14" is arranged centrally between the two connecting portions 12, 12', so that the two connecting regions 12, 12' together with the connecting portion 14" form an H-shape in plan view.

As a result of this arrangement, the center of gravity of the component carrier 1, which shifts as a result of mounting the electrical component 3, can be re-centered overall.

Even where combinations of different aspects or features of the invention are shown in the figures in each case, it is clear to a person skilled in the art—unless indicated otherwise—that the combinations shown and discussed are not the only possible combinations. In particular, mutually corresponding units or feature complexes from different exemplary embodiments can be interchanged with one another.

LIST OF REFERENCE SIGNS

1 Component carrier
11 Base region
110 Supporting surface(s)
12,12' Connecting portion
120,120' Lateral surface(s)/assembly surface(s)
13,13' Top plate
130,130',13" Top surface
14,14',14" Reinforcing elements (web/half-cone/connecting region)
2,2' Traces
20 Circuit board connection regions/circuit board connection pads
20' Component connection regions/component connection pads
3 Electrical component, microprocessor
3' LED lights, light-emitting diode
3" Acceleration sensors

The invention claimed is:

1. A component carrier made of an electrically insulating material, the component carrier comprising a base region with one or more supporting surfaces for electrical and mechanical connection to a circuit board, and having at least one substantially flat connecting portion, which extends substantially at a right angle to the base region and possesses at least one planar lateral surface as an assembly surface, on which one or more electrical components can be assembled, and which furthermore possesses a top surface, which is arranged an at end of the connecting portion which is remote from the base region, which top surface is aligned parallel to the base region and serves as a suction surface for automated circuit board population as well as being usable as a further assembly surface for the assembly of one or more further electrical components,
wherein the component carrier is provided with a plurality of traces, which, on the circuit board connection side, are guided along at least one of the supporting surfaces of the base region and end there in order to be soldered to the circuit board by their respective circuit board connection regions and, at their other end in each case, are guided to the respective assembly position of at least one of the electrical components and end in each case with their component connection regions in the vicinity of the electrical connections of the electrical component which is to be assembled there.

2. The component carrier as claimed in claim 1, wherein the component carrier is made of plastic.

3. The component carrier as claimed in claim 1, wherein the component carrier is produced using a molded interconnect device (MID) method.

4. The component carrier as claimed in claim 1, wherein the component carrier with its traces is manufactured using a laser direction structuring (LDS) method.

5. The component carrier as claimed in claim 1, wherein the connecting portion is designed to be flat on both sides and therefore possesses two mutually opposing assembly surfaces, and wherein, on the connecting portion, at an end which is remote from the base region, a top plate is integrally formed such that it is parallel to the base region, which top plate has the top surface on its side which is remote from the base region.

6. The component carrier as claimed in claim 5, wherein the top plate on the connecting portion points away from the connecting portion on one side only, i.e. in the direction of one of its two mutually opposing assembly surfaces, so that the component carrier with its base region, its connecting portion and its top plate, integrally formed thereon on one side, has an l-shaped cross section according to the Courier New font ("typewriter letters").

7. The component carrier as claimed in claim 5, wherein the top surface is integrally formed over the entire width of the connecting portion on the end of the connecting portion which is remote from the base region, i.e. the top surface has the same width as the connecting portion.

8. The component carrier as claimed in claim 5, wherein the top plate is narrower than the connecting portion.

9. The component carrier as claimed in claim 8, wherein the top plate is integrally formed centrally on the end of the connecting portion so that the connecting portion, at its end which is remote from the base region, possesses a respective freestanding edge portion on both sides of the top plate and therefore possesses a total of two freestanding edge portions.

10. The component carrier as claimed in claim 1, wherein the connecting portion possesses just one assembly surface, and wherein a web is integrally formed as a reinforcing element on the surface of the connecting portion which is opposite the assembly surface.

11. The component carrier as claimed in claim 1, wherein the connecting region possesses just one assembly surface, and wherein, for reinforcement, a solid cylinder or a solid half-cone, whereof the side which is remote from the base forms the top surface, is integrally formed on the connecting portion, on its surface which is opposite the assembly surface, wherein, in the case of a half-cone, this tapers conically from the base region to the top surface.

12. The component carrier as claimed in claim 11, wherein the connecting portion which is reinforced by a half-cylinder or half-cone is designed to be Ω shaped, looking onto the top surface.

13. The component carrier as claimed in claim 1, wherein the component carrier has a further identically shaped connecting portion in addition and parallel to the connecting portion, wherein the connecting portion and the further connecting portion are mutually connected to one another via a connecting region, which possesses a surface which is remote from the base region and which forms the top surface.

14. A method for populating a circuit board with electrical components with at least one component carrier as claimed in claim 1, comprising the following steps:
a.) creating a circuit board design with traces and at least one standardized geometrical arrangement of the contact connections thereof, namely a footprint;
b.) producing the circuit board with the circuit board design;
c.) selecting or providing the at least one component carrier with traces,
whereof the circuit board connection regions form a geometrical pattern on the at least one supporting surface of the component carrier, which pattern corresponds to the footprint of the circuit board, and which,
on the other hand, on the component connection side, end in the region of a position on the component carrier which is provided for mounting the at least one electrical component;

d.) mounting the at least one electrical component on an assembly surface or top surface of the component carrier;

e.) electrically connecting the electrical connections of the electrical component to the component connection regions of the traces;

f.) populating the circuit board with the at least one component carrier by soldering the circuit board connection regions of the component carrier to the contact connections of the circuit board.

15. The method as claimed in claim 14, wherein, in method step f.), the traces 2 are applied to the component carrier using an LDS method.

16. The method as claimed in claim 1, wherein method step f.) takes place using a surface mounted technology (SMT) method.

\* \* \* \* \*